(12) United States Patent
Fischer et al.

(10) Patent No.: US 12,223,233 B2
(45) Date of Patent: Feb. 11, 2025

(54) METHOD AND SYSTEM FOR COMPUTER-AIDED DESIGN OF A TECHNICAL SYSTEM

(71) Applicant: Siemens Aktiengesellschaft, Munich (DE)

(72) Inventors: Jan Fischer, Munich (DE); Vincent Malik, Munich (DE); Jan Christoph Wehrstedt, Munich (DE); Nils Weinert, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 1203 days.

(21) Appl. No.: 16/976,337

(22) PCT Filed: Feb. 14, 2019

(86) PCT No.: PCT/EP2019/053651
§ 371 (c)(1),
(2) Date: Jan. 11, 2021

(87) PCT Pub. No.: WO2019/166227
PCT Pub. Date: Sep. 6, 2019

(65) Prior Publication Data
US 2021/0141985 A1 May 13, 2021

(30) Foreign Application Priority Data
Feb. 28, 2018 (EP) ..................................... 18159206

(51) Int. Cl.
*G06F 30/13* (2020.01)
*G06F 16/953* (2019.01)
(Continued)

(52) U.S. Cl.
CPC ............ *G06F 30/13* (2020.01); *G06F 16/953* (2019.01); *G06F 30/10* (2020.01); *G06F 30/27* (2020.01); *G06N 3/08* (2013.01)

(58) Field of Classification Search
CPC ........ G06F 30/27; G06F 16/953; G06F 30/10; G06F 30/20; G06F 30/00; G06N 3/08
See application file for complete search history.

(56) References Cited

U.S. PATENT DOCUMENTS

| 5,727,127 A | 3/1998 | Schulze Horn et al. |
| 2013/0013543 A1 | 1/2013 | Duell et al. |

(Continued)

FOREIGN PATENT DOCUMENTS

| CN | 107103362 A | 8/2017 | |
| EP | 1857970 A1 | 11/2007 | |
| WO | WO-2018147104 A1 * | 8/2018 | ............. G06F 30/17 |

OTHER PUBLICATIONS

Jeon et al. "Automatic CAD model retrieval based on design documents using semantic processing and rule processing". Computers in Industry, vol. 77, 2016, pp. 29-47, ISSN 0166-3615. (Year: 2016).*

(Continued)

*Primary Examiner* — Eunhee Kim
(74) *Attorney, Agent, or Firm* — Schmeiser, Olsen & Watts, LLP

(57) ABSTRACT

A component of the technical system, a component designation and a characteristic parameter designation for a characteristic parameter of relevance to the design of the components are read and a search engine is queried with same is provided. The documents found by the search engine are read and component information, e.g. product information concerning a specific component, is extracted from said documents. The extracted component information is supplied to a machine learning routine which has been trained, (Continued)

using a plurality of predefined training component information and training characteristic parameter values, to reproduce predefined training characteristic parameter values using predefined training component information. Output data from the machine learning routine is selected as characteristic parameter values and inserted into a planning data record. The planning data record is then output to design the technical system.

15 Claims, 1 Drawing Sheet

(51) Int. Cl.
*G06F 30/10* (2020.01)
*G06F 30/27* (2020.01)
*G06N 3/08* (2023.01)

(56) References Cited

U.S. PATENT DOCUMENTS

2016/0042296 A1* 2/2016 Shan ............... G06N 5/022
  706/11
2017/0193402 A1 7/2017 Grehant

OTHER PUBLICATIONS

Gao, G., Liu, Y.S., Lin, P., Wang, M., Gu, M. and Yong, J.H., 2017. BIMTag: Concept-based automatic semantic annotation of online BIM product resources. Advanced Engineering Informatics, 31, pp. 48-61. (Year: 2017).*

Leu, Ming C., Hoda A. ElMaraghy, Andrew YC Nee, Soh Khim Ong, Michele Lanzetta, Matthias Putz, Wenjuan Zhu, and Alain Bernard. "CAD model based virtual assembly simulation, planning and training." CIRP Annals 62, No. 2 (2013): 799-822. (Year: 2013).*

Paredis, Christiaan JJ, Antonio Diaz-Calderon, Rajarishi Sinha, and Pradeep K. Khosla. "Composable models for simulation-based design." Engineering with Computers 17 (2001): 112-128. (Year: 2001).*

Chuanqi Tan et al: "S-Net: From Answer Extraction to Answer Generation for Machine Reading Comprehension", arxiv.org, Cornell University Library, 201 Olin Library Cornell University Ithaca, NY 14853, XP080770081, Abstract, Title, Part 4.1; Table 1, the whole document; 2017; 11 pages.

Figure 1:
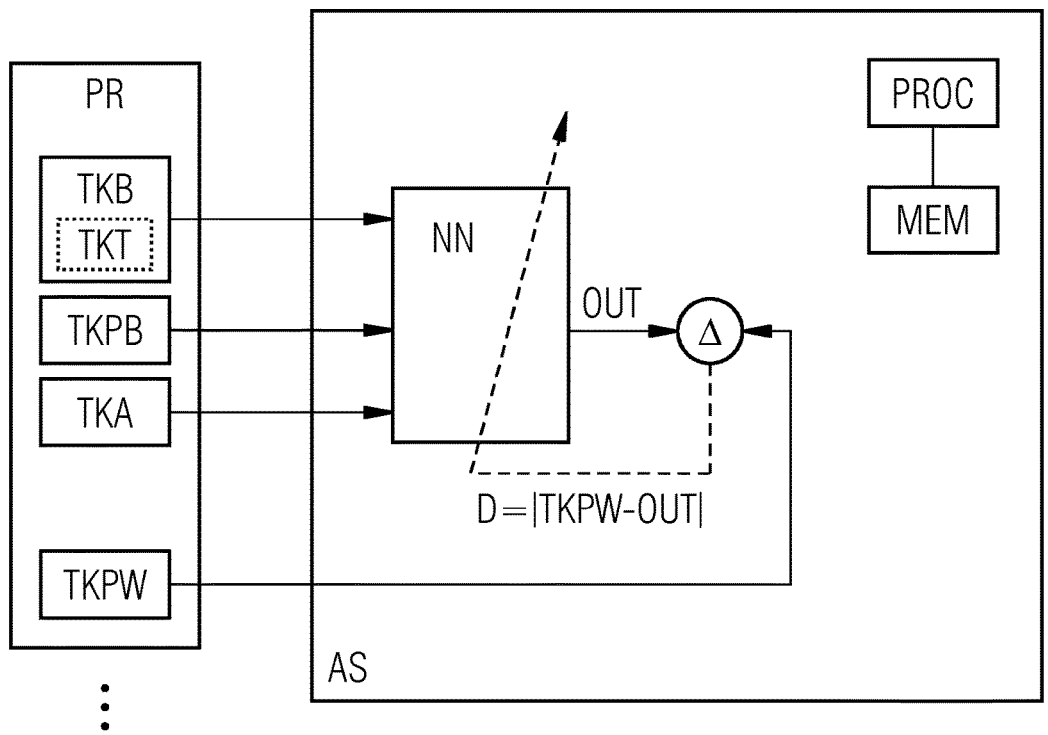

Dombrowski U. et al: "Scenario-based Simulation Approach for Layout Planning", Procedia CI RP, vol. 12, pp. 354-359, XP055487775, NL; ISSN: 2212-8271, DOI:10.1016/j.procir.2013.09.061, Abstract, parts 2.2, 2.3, 2.4, 3.3; Figures 1, 3, 6; pp. 358, lines 11-12;16-18;31-32, the whole document; 2013; 6 pages.

European Examination Report in corresponding European Patent Application No. 18159206.4 dated Aug. 16, 2018. 3 pages.

Extended European Search Report in corresponding European Patent Application No. 18159206.4 dated Nov. 8, 2018. 17 pages.

International Search Report and Written Opinion in corresponding PCT Patent Application No. PCT/EP2019/053651 dated Jun. 27, 2019. 24 pages.

Computer-Aided Design (CAD) Modeling: Definition, Types, and Examples, retrieved on May 7, 2024 from the Internet: <URL: https://www.xometry.com/resources/3d-printing/cad-modeling/.

* cited by examiner

METHOD AND SYSTEM FOR COMPUTER-AIDED DESIGN OF A TECHNICAL SYSTEM

CROSS-REFERENCE TO RELATED APPLICATIONS

This application is a national stage entry of PCT Application No. PCT/EP2019/053651 having a filing date of Feb. 14, 2019, which claims priority to European Patent Application No. 18159206.4, having a filing date of Feb. 28, 2018, the entire contents of which are hereby incorporated by reference.

FIELD OF TECHNOLOGY

The following relates to a computer-aided design of a technical system.

BACKGROUND

Increasing use is being made of computer-aided design and planning instruments in order to design complex technical systems, for example production installations, power grids, wind turbines, gas turbines, power plants, robots, industrial installations or motor vehicles. To this end, the system components to be installed need to be depicted as formalized planning components of a planning model. This may however prove to be highly challenging in particular in the case of complex systems, in that a respective component is often supplied by a multiplicity of manufacturers and is specified in numerous ways that are not formalized.

SUMMARY

An aspect of the present invention is to specify a method, an arrangement, a computer program product and a computer-readable storage medium by way of which it is possible to reduce complexity when designing a technical system.

An aspect relates to the computer-aided design of a technical system for a respective component of the technical system, a component name and a characteristic parameter name for a design-relevant characteristic parameter of the component are read in, a search engine is actuated with the read-in component name and/or characteristic parameter name as search term and documents found by the search engine are read in. A respective characteristic parameter name may in this case in particular specify which characteristic parameter of the respective component should be defined for a specific design of the technical system. Component specifications, for example product information about a respective component, are extracted from the found documents and fed to a machine learning routine that has been trained, on the basis of a multiplicity of predefined training component specifications and training characteristic parameter values, to reproduce predefined training characteristic parameter values on the basis of predefined training component specifications. A planning data record for the technical system is also generated, wherein output data from the machine learning routine are selected as characteristic parameter values and inserted into the planning data record. The planning data record is then output in order to design the technical system.

In order to perform the method according to the invention, an arrangement, in particular an assistance system for the computer-aided design of the technical system, a computer program product (non-transitory computer readable storage medium having instructions, which when executed by a processor, perform actions).

The method according to the invention and the arrangement according to the invention may be executed or implemented for example by way of one or more processors, application-specific integrated circuits (ASIC), digital signal processors (DSP) and/or what are known as field-programmable gate arrays (FPGA).

One advantage of the invention is in particular that planning data records are able to be parameterized largely automatically. Such parameterized planning data records may then often be incorporated directly into data models of automated planning methods. By virtue of incorporating a search engine, largely comprehensive information about available components and their characteristic parameters are also able to be taken into consideration for the design. This generally increases an optimization margin and consequently leads to better planning results in many cases.

The machine learning routine may advantageously be implemented by way of an artificial neural network, a recurrent neural network, a convolutional neural network, an autoencoder, a deep learning architecture, a support vector machine, a data-driven trainable regression model, a k-nearest-neighbor classifier, a physical model and/or a decision tree. A multiplicity of efficient standard methods may be used to train a machine learning routine implemented in this way.

According to one advantageous embodiment of the present invention, a target value for a design parameter predefined for the technical system may be read in and the characteristic parameter values may be selected depending on the read-in target value. The design parameter may in this case relate to and/or quantify a predefined requirement, function, boundary condition or other property of the technical system or a component. The design parameter may in particular relate to operationally relevant, functionally relevant or production-relevant properties such as supply times, maintenance cycles, etc. A desired or required value or value range for the design parameter may be read in as target value. A characteristic parameter value closest to or close to the target value may in particular be selected in the selection. As an alternative or in addition, characteristic parameter values that do not exceed or fall below the target value may be selected.

A simulator of the technical system may furthermore be configured by way of the generated planning data record. A technical function of the technical system may then be simulated by way of the configured simulator, and a functional specification about the simulated technical function may be output. The simulator may for example perform an event-based and/or time-discrete simulation, in particular a logistic simulation. An operational function of the technical system or of part thereof, for example a power, a speed, a material transport, a yield or another capability or property may in particular be simulated as technical function. The characteristic parameter values to be inserted into the planning data record may in particular be selected such that a deviation of the functional specification from a functional requirement predefined for the technical system is reduced. The function of the technical system is thereby able to be adapted to the functional requirement and/or the function is able to be optimized.

According to a further advantageous embodiment of the present invention, a multiplicity of planning data records each containing characteristic parameter values selected differently from output data from the machine learning routine may be generated. A technical function of the technical system may be simulated for a respectively generated planning data record by way of a simulator. A planning data record that optimizes the simulated technical function may then be selected from the multiplicity of generated planning data records in order to design the technical system.

According to one advantageous development of the present invention, a component type specification may be read in for a respective component. The extracted component specifications may then be fed, together with a respective component type specification, to a machine learning routine trained specifically on component types. "Production machine" or "transport system" may be provided for example as component type specification. Component type-specific training proves to be highly efficient in many cases, since the assignment of characteristic parameter names to characteristic parameter values often exhibits a high correlation in terms of type specificity.

There may furthermore be provision for the machine learning routine to have been trained, on the basis of a multiplicity of predefined training component specifications, training characteristic parameter names and training characteristic parameter values, to reproduce predefined training characteristic parameter values on the basis of predefined training component specifications and training characteristic parameter names. The machine learning routine may then be fed the characteristic parameter names in association with the extracted component specifications. Explicitly taking into consideration the training characteristic parameter names when training the machine learning routine and also the characteristic parameter names when using the trained machine learning routine may considerably improve determination of the characteristic parameter values in many cases.

The search engine may advantageously use a product data-focused web crawler to search through a data network, in particular the Internet or an intranet. A focused web crawler is able to classify visited sites thematically and restrict indexing thereof to thematically relevant sites. A proportion of relevant documents in the found documents is thereby able to be increased in many cases.

According to a further advantageous embodiment of the present invention, the component specifications may be extracted from the found documents by way of a parser, for example HTML, or XML parser, and/or a pattern recognizer.

A respective component name and/or characteristic parameter name may furthermore be read in from a blueprint of the technical system. An electronic blueprint, for example a CAD planning design for the technical system, may in particular be used as blueprint.

The multiplicity of training characteristic parameter values may furthermore be extracted from a multiplicity of parameterized planning data records. A parameterized planning data record should be understood to mean in particular a planning data record containing inserted characteristic parameter values that are uniformly formalized. Suitable parameterized planning data records are often available from designs of technical systems that have been produced earlier, or may be derived therefrom. Parameterized planning data records of similar technical systems may be used. In many cases, however, it is also possible to make beneficial use of parameterized planning data records of different technical systems, since there are often cross-system correlations between component names, characteristic parameter names and characteristic parameter specifications that are able to be learned by a machine learning routine.

BRIEF DESCRIPTION

Figure 2:
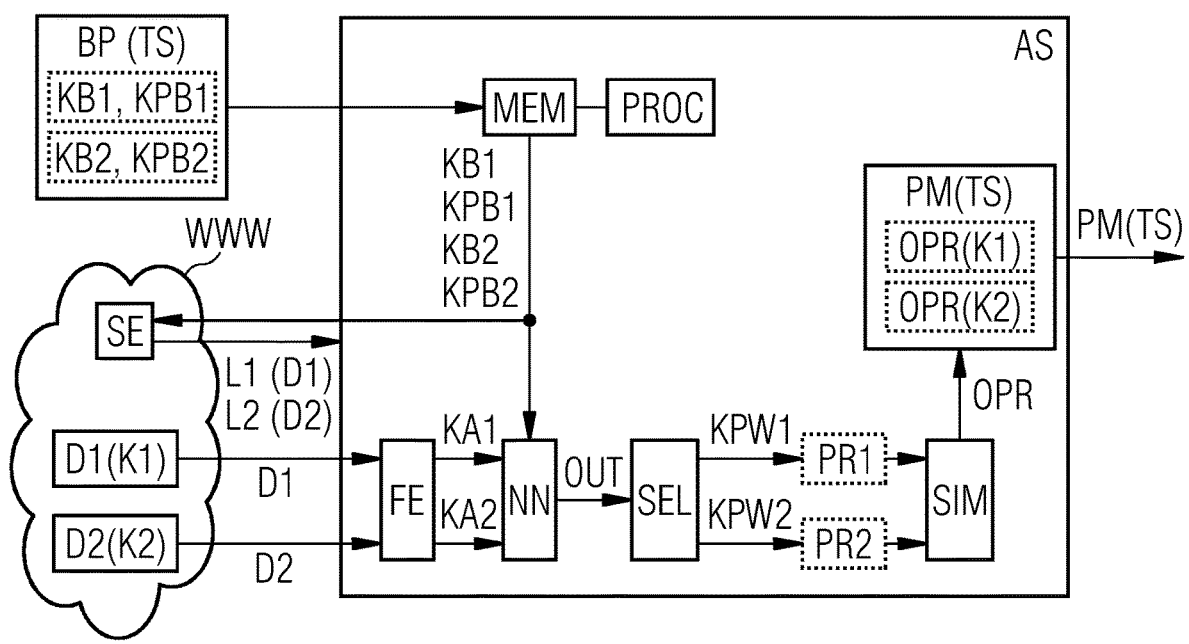

Some of the embodiments will be described in detail, with reference to the following figures, wherein like designations denote like members, wherein:

FIG. 1 depicts an assistance system for designing a technical system in a training phase of the assistance system; and FIG. 2 depicts the trained assistance system in an application phase.

DETAILED DESCRIPTION

FIG. 1 schematically shows an assistance system AS, in a training phase, for designing a technical system. The assistance system AS may be used to design a multiplicity of technical systems, such as for example production installations, power grids, wind turbines, gas turbines, power plants, robots, industrial installations, motor vehicles or combinations thereof. The technical systems to be developed in this case each comprise a multiplicity of different technically interacting components, such as for example electrical or mechanical component parts, production robots, machine tools, transport systems, conveyor belts and/or other machines or machine parts.

For the design, it needs to be ascertained in particular which components having which properties are required and available to construct the technical system. The components may in this case originate from a multiplicity of suppliers or manufacturers.

In order to finalize the design, specific values of characteristic parameters of a respective component need to be defined or adapted for this component. Such component-specific characteristic parameters quantify the properties of the respective component that are relevant to the design of a technical system, such as for example their dimensions, their resource consumption, their capabilities and/or their functions.

Unparameterized planning models are then for example able to be parameterized on the basis of the ascertained characteristic parameter values, and the parameterized planning models are able to be used for the production or quantitative simulation of the technical system.

Such an unparameterized planning model may be for example a blueprint or another planning model, in which the components and their design-relevant characteristic parameters are named but not yet quantified, for example because it is not yet known which specific characteristic parameter values the components available on the market have.

The assistance system AS has one or more processors PROC for executing the method steps of the assistance system AS, and one or more memories MEM for storing data to be processed by the assistance system AS.

According to the embodiment of the present invention, the assistance system AS comprises a trainable artificial neural network NN by which a machine learning routine is implemented. The neural network NN needs to be trained to extract characteristic parameter values of a multiplicity of components of technical systems in a uniformly formalized manner or in a uniform machine-readable format from text-based specifications about these components.

In order to train the neural network NN, a multiplicity of predefined parameterized planning data records PR for components whose characteristic parameter values are known are read in by the assistance system AS. The planning data records PR may be read in for example from one or more component catalogs, component libraries or other databases.

In this case, planning data records PR are read in by components that are also able to be used for the technical system to be designed or for similar technical systems.

The planning data records PR in particular also comprise formalized settings of the relevant components; that is to say their characteristic parameter values are present in the planning data records PR in a uniformly formalized manner.

A multiplicity of training component names TKB are extracted from the planning data records PR. The training component names TKB in each case denote a component and may comprise for example the names "robot" or "conveyor belt". A respective training component name TKB furthermore comprises a training component type specification TKT, for example in the form of the name "production machine" or "transport system". Training characteristic parameter names TKPB are furthermore extracted from the planning data records PR for a respective component, these denoting characteristic parameters, to be defined for a specific design, of the respective component. The names "length", "width", "weight", "positional accuracy", "conveyor speed", "line cross section", "pipe friction value", "tank volume" or "maintenance interval" may for example be used as training characteristic parameter names TKPB.

A multiplicity of training component specifications TKA are furthermore extracted from the planning data records PR, these training component specifications comprising text-based specifications about a respective component, for example product information from a website of a manufacturer or from a component catalog or a component library. These text-based specifications contain in particular quantified values of characteristic parameters of a respective component, but generally in non-formalized text form.

As already mentioned above, the neural network NN is intended to be trained to extract these characteristic parameter values, contained in non-formalized text form, in a uniform machine-readable format. For the purpose of this training, the planning data records PR—as already indicated above—additionally also contain corresponding uniformly formalized training characteristic parameter values TKPW. The training characteristic parameter values TKPW are each assigned to a predefined training component name TKB of a training characteristic parameter name TKPB and a training component specification TKA. A respective training characteristic parameter value TKPW specifies a value or a value range of a characteristic parameter, denoted by the associated training characteristic parameter name TKPB, in a uniform machine-readable format. The formalized specification "10 m" may thus for example be assigned to the component name "conveyor belt" together with the characteristic parameter name "length" and the component specification "blueprint conveyor belt: [ . . . ] length: 10 m". Such component specifications may for example be extracted from the planning data records PR by way of what is known as regular expression.

In order to train the neural network NN, mutually corresponding training component names TKB, training characteristic parameter names TKPB and training component specifications TKA are conveyed thereto as input data.

Training should be understood in this case generally to mean optimization of mapping of input data of a machine learning routine, implemented here by way of the neural network NN, onto output data. This mapping is optimized during a training phase in accordance with predefined and/or learned criteria and/or criteria to be learned. A deviation between desired and actual output data may in this case be used in particular as criterion. The training may for example optimize weights of connections between neurons of the neural network NN or their network structure such that the predefined criteria are met as well as possible.

In the present exemplary embodiment, the training aims for output data OUT derived from the input data by the neural network NN to reproduce the corresponding formalized training characteristic parameter values TKPW as accurately as possible.

To this end, the output data OUT are compared with the training characteristic parameter values TKPW conveyed to the assistance system AS and in each case associated with the input data TKB, TKPB and TKA. In the course of the comparison, a deviation D, for example an absolute value or a square of a difference, between the output data OUT and the training characteristic parameter values TKPW is ascertained. The deviation D is then fed back to the neural network NN. On the basis of the fed back deviation D, the neural network NN—as indicated by a dashed arrow—is trained to minimize the deviation D, that is to say to reproduce the training characteristic parameter values TKPW through the output data OUT derived from the input data as well as possible. In other words, the neural network NN is trained to extract uniformly formalized characteristic parameter values from informal component specifications using the output data OUT. The deviation D in this case represents an extraction error of the neural network NN.

By virtue of taking into account the training component type specification TKT, the training in the present exemplary embodiment takes place in a component type-specific manner, that is to say specific to the type of a respective component. As an alternative or in addition, the training may also be performed in a group-specific manner for commonly installed component groups or component combinations.

In order to train the neural network NN, a multiplicity of standard machine learning methods, in particular supervised learning methods, may be used.

FIG. 2 shows a schematic illustration of the trained assistance system AS in an application phase, that is to say when designing a specific technical system TS. Where the same reference signs as in FIG. 1 are used in FIG. 2, these reference signs denote the same entities. These entities may be implemented or embodied in terms of the functional relationship of FIG. 2 in the same way as described in connection with FIG. 1.

The assistance system AS is intended to serve in the present exemplary embodiment to design a production installation as technical system TS. As an alternative or in addition, the technical system to be constructed may also be a power grid, a wind turbine, a gas turbine, a power plant, a robot, an industrial installation or a motor vehicle or comprise such an arrangement.

In order to design the production installation TS, the trained assistance system AS is intended to generate a planning model PM that specifies the production installation TS on the basis of a blueprint BP of the production installation TS.

The production installation TS to be designed comprises a multiplicity of different technically interacting components. Of these components, only two components K1 and K2 of the production installation TS are referenced explicitly by way of example in FIG. 2 for the sake of clarity. The components K1 and K2 may be for example production robots, machine tools, transport systems, conveyor belts or other machines or machine parts. Properties of the components K1 and K2 are each characterized by their characteristic parameters, as explained above.

The blueprint BP describes a basic structure of the production installation TS consisting of the various components, here K1 and K2, as well as their functional relationship. The blueprint BP is however not yet parameterized, that is to say it contains component names KB1 and KB2 of the components K1 and K2 and characteristic parameter names KPB1 and KPB2 of characteristic parameters of the components K1 and K2, but not yet or not yet fully the specific values of these parameters. As already mentioned above, the component names KB1 and KB2 may comprise names, such as for example "robot" or "conveyor belt". In the present exemplary embodiment, the component names KB1 and KB2 furthermore each comprise a component type specification, such as for example "production machine" or "transport system".

As already indicated above, for the design with the aid of the assistance system AS, it needs to be ascertained which components having which characteristic parameter values are required and available to construct the production installation TS.

To this end, the assistance system AS first of all reads in the component names KB1 and KB2 of the required components K1 and K2 and their characteristic parameter names KPB1 and KPB2 from the unparameterized blueprint BP and stores them in the memory MEM.

For a respective component K1 and K2, a search engine SE is then actuated with the read-in names KB1 and KPB1 or KB2 and KPB2 as search terms. In this case, the search terms are conveyed to the search engine SE, which accordingly returns references to documents in which the search terms occur. For the sake of clarity, FIG. 2 explicitly references only two such references L1 and L2 to documents D1 and D2 by way of example. An external or internal search engine for a data network WWW, such as the Internet or the intranet, may be used as search engine SE. In the present exemplary embodiment, the World Wide Web is searched through as data network www by the search engine SE. The found documents D1 and D2 are often hypertext or PDF documents that originate from web sites of manufacturers or suppliers of a respective component K1 or K2. The documents D1 and D2 generally contain informal manufacturer-specific product information about the relevant component K1 or K2 in a manufacturer-specific format.

The search engine SE comprises or uses what is known as a web crawler, in particular a product data-focused web crawler, to search through the data network WWW. Such a web crawler classifies web sites and hyperlinks thematically, here in terms of existing product data, and restricts indexing thereof to thematically relevant websites.

The documents found by the search engine, here D1 and D2, are retrieved by the assistance system AS from the data network WWW and subjected to a feature extraction FE. The feature extraction FE comprises an HTML, and/or PDF parser that extracts text content from the documents D1 and D2. The feature extraction FE furthermore uses a downstream pattern recognizer that is designed specifically to recognize text patterns and to extract associated text content. Such a pattern recognizer may be implemented for example by way of what are known as regular expressions.

In the present exemplary embodiment, the feature extraction FE recognizes text sections in the documents D1 and D2 that contain the characteristic parameter names KPB1 and KPB2. A respective component specification KA1 or KA2, textually associated with the characteristic parameter name KPB1 or KPB2, is then extracted from the recognized text sections. These component-specific text-based component specifications KA1 and KA2 of the manufacturers generally contain the quantified values of the characteristic parameters of the respective component, but generally in non-formalized text form.

For a respective component K1 or K2, the names KB1 and KPB1 and the component specification KA1 or the names KB2 and KPB2 and the component specification KA2, assigned to one another, are conveyed to the trained neural network NN as input data. The trained neural network NN derives output data OUT from the input data. The output data OUT are conveyed by the neural network NN to a selection module SEL that selects component-specific and characteristic parameter-specific characteristic parameter values from the output data OUT. Only two characteristic parameter values KPW1 and KPW2 are referenced explicitly in FIG. 2 by way of example for the sake of clarity. The characteristic parameter value KPW1 or KPW2 in this case specifies a value or value range of a characteristic parameter denoted by the characteristic parameter name KPB1 or KPB2.

Uniformly formalized characteristic parameter values KPW1 and KPW2 are thus able to be extracted in a planning-related manner from informal manufacturer-specific documents D1 and D2 by way of the trained neural network NN.

The characteristic parameter values KPW1 and KPW2 are each inserted into a planning data record PR1 or PR2 for the relevant component K1 or K2 in association with the relevant characteristic parameter name KPB1 or KPB2. The respective planning data record PR1 or PR2 is thereby parameterized, that is to say specific characteristic parameter values, here KPW1 or KPW2, are inserted into the respective planning data record PR1 or PR2 for previously still undetermined characteristic parameters. The planning data record PR1 or PR2 thus as it were forms a parameterized instance of a planning component.

A multiplicity of parameterized planning data records for a multiplicity of documents found by the search engine SE and a multiplicity of characteristic parameter values specified therein are generated in the manner described above.

In order to derive a planning model PM that is optimized and specifies the production installation TS from the generated planning data records, the assistance system AS has a simulator SIM. The simulator SIM uses one or more parameterized planning data records to simulate a resultant dynamic behavior of the production installation TS, a behavior of a respective component and/or a technical interaction of components. The simulation is performed in each case for different, in particular typical and/or predefined operating situations. The simulator SIM to this end comprises a configurable system model of the components and of the technical interaction of the components.

The simulator SIM simulates in each case one or more technical functions of the production installation TS, for example material transport and/or workpiece machining, for the multiplicity of parameterized planning data records. From the multiplicity of parameterized planning data records, a component-specific planning data record OPR that optimizes this technical function is then selected and inserted into the planning model PM. The above optimizing selection is performed for each of the components and/or specifically for each component type.

Planning data records and/or planning models optimized in this way may be stored in a database or planning library that spans planning projects. Such a database or planning library may advantageously be used for further planning projects.

As an alternative or in addition to the above-described selection of optimizing planning data records OPR, the simulator SIM may also control the selection of the characteristic parameter values from the output data OUT from the neural network NN. The selection may in this case in particular take place depending on the technical function, simulated in a manner specific to the characteristic parameter value, of the production installation TS and the comparison thereof with a predefined functional requirement. A conveyor speed, required for the production installation TS, of a conveyor belt component, a positional accuracy of a robot component, a resource consumption and/or another target value for a design parameter may in this case for example be predefined as functional requirement.

The optimized planning model PM generated in this way comprises a multiplicity of optimizing parameterized planning data records OPR that specify the production installation TS and may be used for production or quantitative simulation of a production installation TS that is optimized in this respect. The optimized planning model PM is finally output by the assistance system AS in order to design the production installation TS.

The embodiment of the present invention allows largely automatic generation of instances of planning components that are often able to be incorporated directly into models of predefined planning methods. By virtue of automatically incorporating an Internet search by way of the search engine SE, largely comprehensive information about available components and their characteristic parameters is able to be taken into consideration in the planning. By virtue of automatically taking into consideration a plurality of solution alternatives in a planning method, a greater solution space, for example in the context of heuristic planning and/or optimization approaches, is in particular able to be often evaluated. This generally increases an optimization margin and consequently leads to better planning results in many cases.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

What is claimed:

1. A method for computer-aided design of a technical system, said method comprising:
   for a respective component of the technical system;
      actuating a search engine, said actuating using a search term comprising a component name and/or a characteristic parameter name for a design-relevant characteristic parameter of the component; and
      extracting component specifications from documents found by the search engine;
   training a machine learning routine on a basis of a multiplicity of predefined training component specifications and predefined training characteristic parameter values, to reproduce predefined training characteristic parameter values on a basis of predefined training component specifications;
   executing the trained machine learning routine, said executing using input data and generating output data, wherein the input data comprises the extracted component specifications;
   generating a planning data record for the technical system, wherein characteristic parameter values are selected from the output data generated from said executing the trained machine learning routine and are inserted into the planning data record during said generating the planning data record, wherein the characteristic parameter values are design relevant characteristic parameters of components; and
   outputting the planning data record in order to design the technical system.

2. The method as claimed in claim 1, wherein the machine learning routine is implemented by way of an artificial neural network, a recurrent neural network, a convolutional neural network, an autoencoder, a deep learning architecture, a support vector machine, a data-driven trainable regression model, a k-nearest-neighbor classifier, or a decision tree.

3. The method as claimed in claim 1, wherein the selected characteristic parameter values were selected depending on a target value for a design parameter predefined for the technical system.

4. The method as claimed claim 1, wherein the method comprises:
   configuring a simulator of the technical system by way of the generated planning data record;
   simulating a technical function of the technical system by way of the configured simulator (SIM); and
   outputting a functional specification about the simulated technical function.

5. The method as claimed in claim 4, wherein the characteristic parameter values to be inserted into the planning data record are selected such that a deviation of the functional specification from a functional requirement predefined for the technical system is reduced.

6. The method as claimed in claim 1, wherein the method comprises:
   generating a multiplicity of planning data records each containing characteristic parameter values selected differently from the output data generated from said executing the machine learning routine;
   simulating a technical function of the technical system by way of a simulator for a respectively generated planning data record; and
   selecting a planning data record that optimizes the simulated technical function from the multiplicity of generated planning data records in order to design the technical system.

7. The method as claimed in claim 1,
   wherein the trained machine learning routine was trained in a component type-specific manner; an
   wherein the method comprises: feeding the extracted component specifications, together with a respective component type specification, to the machine learning routine.

8. The method as claimed in claim 1, wherein:
   the machine learning routine has been trained, on the basis of a multiplicity of predefined training component specifications, training characteristic parameter names and training characteristic parameter values, to reproduce predefined training characteristic parameter values on the basis of predefined training component specifications and training characteristic parameter names; and
   the machine learning routine that was trained on the basis of the multiplicity of predefined training component specifications is fed the characteristic parameter names in association with the extracted component specifications.

9. The method as claimed in claim 1, wherein the search engine uses a product data-focused web crawler to search through a data network.

10. The method as claimed in claim 1, wherein the component specifications are extracted from the found documents by way of a parser and/or a pattern recognizer.

11. The method as claimed in claim 1, wherein a respective component name and/or characteristic parameter name is read in from a blueprint of the technical system.

12. The method as claimed in claim 1, further comprising:
parameterizing a multiplicity of planning data records that include the generated planning data record for the technical system; and
extracting a multiplicity of training characteristic parameter values from the multiplicity of parameterized planning data records.

13. A computer system for computer-aided design of a technical system, said computer system comprising one or more processors configured to perform the method as claimed in claim 1.

14. A computer program product comprising a computer readable hardware storage device storing computer readable program code that is executable by a processor of a computer system to implement the method according to claim 1.

15. The computer program product as claimed in claim 14, wherein a non-transitory computer-readable storage medium comprises the computer program product.

* * * * *